United States Patent [19]
Yajima et al.

[11] Patent Number: 5,827,110
[45] Date of Patent: Oct. 27, 1998

[54] POLISHING FACILITY

[75] Inventors: Hiromi Yajima, Yokohama; Yukio Imoto, Zama; Shoichi Kodama; Riichiro Aoki, both of Tokyo; Takashi Omichi, Fujisawa; Toyomi Nishi, Yokohama; Tetsuji Togawa, Fujisawa, all of Japan

[73] Assignees: Kabushiki Kaisha Toshiba, Kawasaki, Japan; Ebara Corporation, Tokyo, Japan

[21] Appl. No.: 580,312

[22] Filed: Dec. 28, 1995

[30] Foreign Application Priority Data

Dec. 28, 1994 [JP] Japan .................................. 6-339165
Dec. 28, 1994 [JP] Japan .................................. 6-339166
Dec. 28, 1994 [JP] Japan .................................. 6-339167

[51] Int. Cl.[6] .............................. B24B 7/22; B24B 51/00
[52] U.S. Cl. ................................ 451/5; 451/67; 451/288
[58] Field of Search ............................... 451/5, 287, 288, 451/290, 65, 66, 41

[56] References Cited

FOREIGN PATENT DOCUMENTS 63-207559  8/1988  Japan .

Primary Examiner—Robert A. Rose
Attorney, Agent, or Firm—Wenderoth, Lind & Ponack, LLP

[57] ABSTRACT

A polishing facility integrates separate components of polishing such as wafer transport, polishing, cleaning and drying in one standardized facility to provide efficient polishing operation at low cost. The facility is designed to deal with a variety of different types of wafers, including different types of surface film, and is designed also to enables quick and low cost upgrading of the facility to meet advancing requirements of customers. The polishing facility can be placed within a cleanroom to provide efficient handling of polished wafers for further processing and fabrication tasks. Individual work component of polishing is arranged in one block having its own power supply and signal lines, and is controlled by a central controller having a dedicated software program for each work component. Therefore, if upgrading of the facility is required on any work component, only that work component requiring attention needs to be repaired/replaced, thus eliminating the need to shut down the entire facility as in conventional polishing setups. Each work component is modularized for easy replacement and inventory purposes. The overall effect of the integrated polishing facility is that the efficiency of the polishing operation is significantly improved at minimal cost of labor and capital investments.

21 Claims, 9 Drawing Sheets

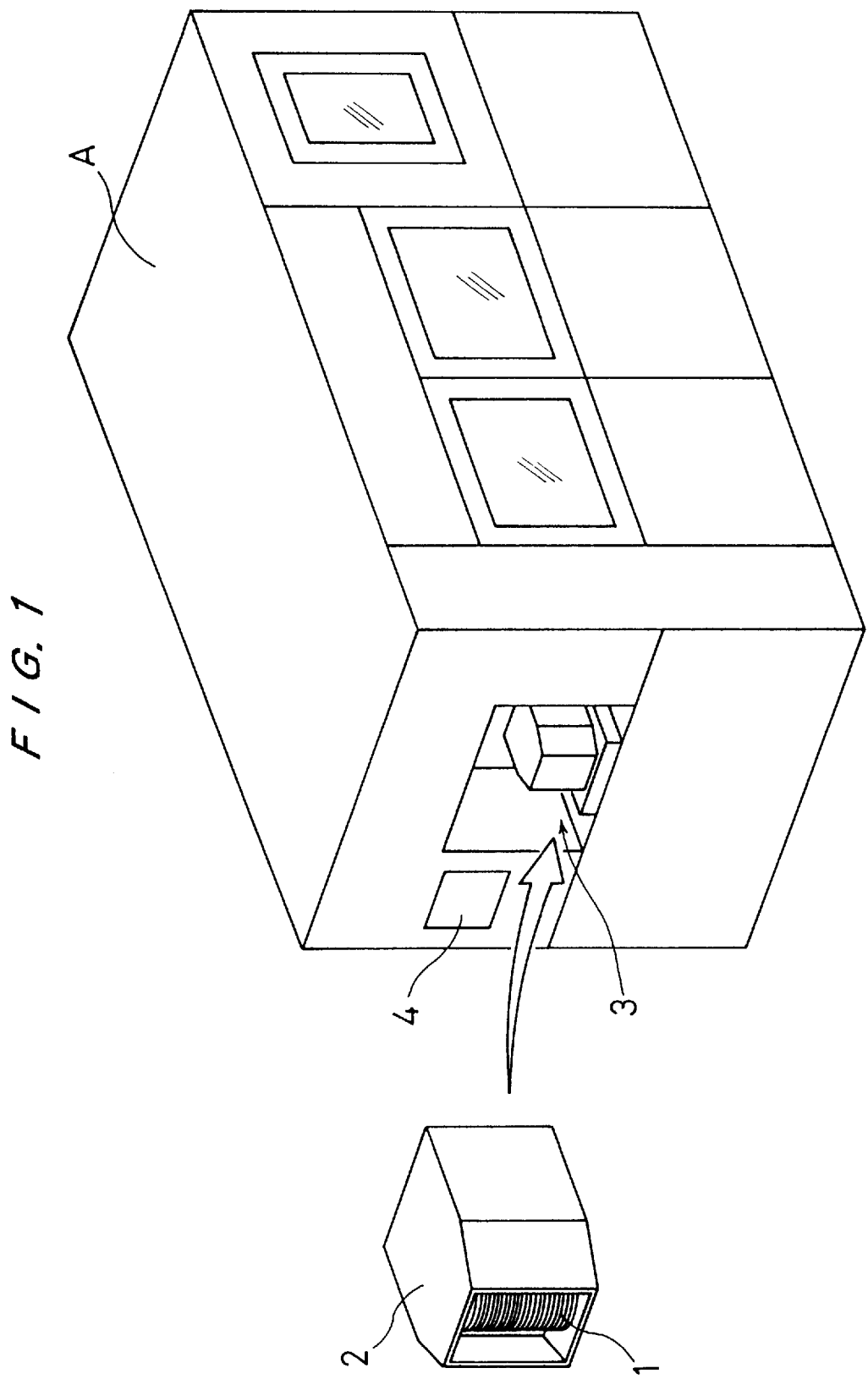

POLISHING FACILITY

BACKGROUND OF THE INVENTION

1. Field of the Invention

The present invention relates in general to apparatus for polishing of objects, and relates in particular to an integrated polishing facility for producing a flat and mirror polished surface on a semiconductor wafer.

2. Description of the Related Art

High density integrated semiconductor devices of recent years require increasingly finer microcircuits, and the interline spacing has also shown a steadily decreasing trend. For optical lithography operations based on less than 0.5 micrometer interline spacing, the depth of focus is shallow and high precision in flatness is required on the polishing object which has to be coincident with the focusing plane of the stepper.

Therefore, it is necessary to provide a highly polished and flat surface, i.e. planarization, on the wafer, and one of the applicable method for a planarization process is polishing of the wafer on a polishing apparatus.

Conventional polishing setup is comprised of many individual component devices of a polishing operation, such as a load/unload device for transferring wafers in a cassette, a transport device for transporting the wafers, a polishing device for polishing the wafers, a cleaning device which is a recent addition, and control devices to control all the component devices.

In such a polishing setup, the driving devices for operating the various component devices and their controlling devices are housed in a control cabinet together with a central computer for controlling the operation of the overall setup. The power source and signal generation devices for providing the overall controls are also connected with a common power source and a common control device in the cabinet.

There are several operational problems presented by such a conventional polishing setup. They will be briefly reviewed in the following.

(1) Low Productivity

Modern semiconductor device industries demand a wide variety of wafer types, each of which must be processed in a specific manner. This leads to a corresponding wide variety of processing devices, and it was difficult to standardize the processing devices aimed at cost savings and improving just-in-time delivery schedules.

(2) Poor Adaptability to Upgrading

Product life cycle is typically short in semiconductor device industries, and the demand for upgrading of processing capability is severe; however, this demand cannot be satisfied readily because of the difficulty and the high cost involved in upgrading the devices to meet the demand.

(3) High Maintenance Requirements

Polishing apparatus is usually located in a cleanroom, so dust generation must be kept to the lowest possible level during disassembly for repair and component exchange. However, because of the apparatus configuration, there is a practical limit to meeting this requirement.

(4) Poor Adaptability to Customer Needs

The size of the polishing apparatus and the layout for load/unload positions of the wafer cassettes and the control panels are relatively fixed, and this inflexibility of positioning the devices in the conventional setup presented access problems for the users in many cases.

In addition to these specific problems, the conventional approach of housing in one control panel various operational components, such as driver device for motors, and control valves for the driver, air cylinders and process valves as well as signal interfacing devices, presents additional general problems outlined below.

(5) If a space is reserved for all the possible number of the block in one control panel, the size of the control panel becomes very large, but if a control panel is provided for each block of devices, then many different panels are required and standardization becomes impossible.

(6) In a block-based operation, it is difficult to perform simulation testing to confirm the workings of the setup because each block requires a test stand having all the necessary control functions to deal with different blocks.

(7) When it is necessary to change the setup for upgrading the setup or to meet the demands of customers, and if the changes involve a large scale modification to the setup, such as repositioning of motors, cylinders, valves and interfaces, then it becomes necessary to also modify the layout of the control devices inside the control panel as well as wiring. Therefore, such changes in setup result in high cost, and severe disruptions in delivery schedules.

As a method of avoiding such problems, it may first appear that a remedy is to organize the various devices into functional blocks and providing a control panel for each block. However, to maximize the benefits which may be derived from organizing into functional blocks and to operate the system at its optimum performance level, it is necessary to develop a new concept of control over the various blocks so that control can be exercised over ancillary functions, such as monitoring of operational parameters, in addition to controlling functions which are essential to polishing, such as polishing solution supply, waste management, cooling and/or warm water supplies.

SUMMARY OF THE INVENTION

It is an object of the present invention to provide a polishing facility having high productivity, adaptability to upgrading, ease of maintenance and adaptability to user needs. Another object is to provide polishing facility having a control unit suitable for use with block-based polishing operation as well as having monitoring capability for ancillary devices.

The object has been achieved in a polishing facility comprising functional blocks, i.e., a first functional block relating to an load/unload function block for delivery of cassette storing wafers; a second relating to a transport function block for moving wafers; a third relating to a polishing function block for polishing of wafers; a fourth relating to a cleaning function block for cleaning wafers; and a fifth relating to a control function block for rolling the polishing facility.

The advantage of providing separate functional block is that each block can be standardized, and the efficiency of manufacturing polishing facility is improved because of lower manufacturing cost as well as shorter delivery schedules.

Another advantage is that when upgrading is required, the facility can be improved by exchanging or modifying only that functional block which requires attention. The facility is thus adaptable to upgrading needs of the operation at low cost.

The facility is designed to be flexible to permit relocation of any functional blocks to meet customer requirements.

In another aspect of the facility, the five functional blocks are arrangeable free of inter-block configuration, if upgrading is required on any of the blocks, individual blocks can be replaced or repaired, thus enabling to upgrade the performance at low cost. The facility therefore provides high adaptability to future expansion and improvements. The facility can be maintained efficiently, because if a repair is needed, disassembly is minimal and dust generation is kept low.

In another aspect of the facility, each block may comprise a plurality of sub-blocks performing the same function. The layout of the blocks can be changed to meet any space allowance dictated by individual needs of the user.

In an another version of the polishing facility, each of the load/unload function block, transport function block, polishing function block and cleaning function block is provided with a driver for driving a motor, an electrical terminal for supplying electrical power to the driver, a control valve for controlling operations of an air cylinder and process valves, air supply provisions for supplying air to the control valves, a conversion interface for control signals for the driver and the control valves, as well as a communications terminal for receiving control signals; and the control function block is provided with a power source for supplying electrical power to each of the blocks through an electrical terminal; a computer for generating command signals; a communications terminal to output control signals; an electrical input terminal for receiving input of external electrical power; and an operation panel for commanding the polishing facility.

Standardization of the control panel is made possible because of the features presented above, and each block can be pre-tested and corrected if necessary, independently of all other blocks. These features contributes to lowering in operating cost, shortening of delivery schedules, improvement in reliability and productivity.

Furthermore, if facility upgrading is required in the future, there is no need to produce a new control panel, therefore, the cost of modification is low, and the facility has superior adaptability. If the layout is to be changed to meet customer needs, it is only necessary to re-wire the power cables and signal lines for the blocks concerned.

In another version of the polishing facility, for each function block, the driver, the electrical terminal, the control valves, the air supply provisions, the conversion interface and the communications terminal are housed in an individual chassis means, and devices in the chassis means are made accessible by pulling out the chassis means.

These features assure that control devices can be inspected easily and maintenance can be carried out readily.

In an aspect of the chassis means, it is protected from possible water and chemical damages by providing a drip tray.

As before, the layout can be changed easily to meet customer needs, and relocation/exchange can be made by changing the cables and signal wires only.

In an another version of the facility, each of the load/unload function block, transport function block, polishing function block, and cleaning function block is operatively connected to the control function block through a dedicated power source and dedicated signal lines; and a dedicated control program is provided for each of the load/unload function block, transport function block, polishing function block, and cleaning function block.

Because each of the blocks has its own power supply and signal lines, each block can be operated independent of the other blocks. The operation of each block is controlled by its own program. In other words, dedicated control functions are provided for both hardware and software aspects of each block. This feature provides complete adaptability to future upgrading or improvements to meet customer needs, and if control methodology is to be changed, the minimal changes in hardware and the software are necessary only for the block concerned. There is no need to make a new control panel, thus achieving one of the basic objects of adaptability to future needs of the polishing facility.

Another aspect of the facility presented above is that the control program includes a utility monitoring program. This feature allows monitoring of the operational conditions of the various devices in all the blocks to ensure that utility requirements for the operation of the facility, such as electrical power, purified water, compressed air are properly met all times.

Another aspect of the facility is that it has a polishing solution supply device, a waste management device, a cooling water supply device and a warm water supply device, and each of the devices is operatively connected to the control function block through dedicated signal lines. Each of the devices is controlled by their own signals from the control block, and the wiring needs are significantly reduced by this arrangement. This feature is also an important factor in reducing the production cost.

Another aspect of the facility is that an additional program is provided to control the polishing solution supply device, the waste management device, the cooling water supply device and the warm water supply device, therefore, it is possible to control the entire polishing operation through dedicated software for these ancillary functions which are not included in the basic configuration of functional blocks but are required to maximize the polishing efficiency.

BRIEF DESCRIPTION OF THE DRAWINGS

FIG. 1 is a perspective external view of a first embodiment of the polishing facility of the present invention.

DESCRIPTION OF THE PREFERRED EMBODIMENTS

Figure 2A:
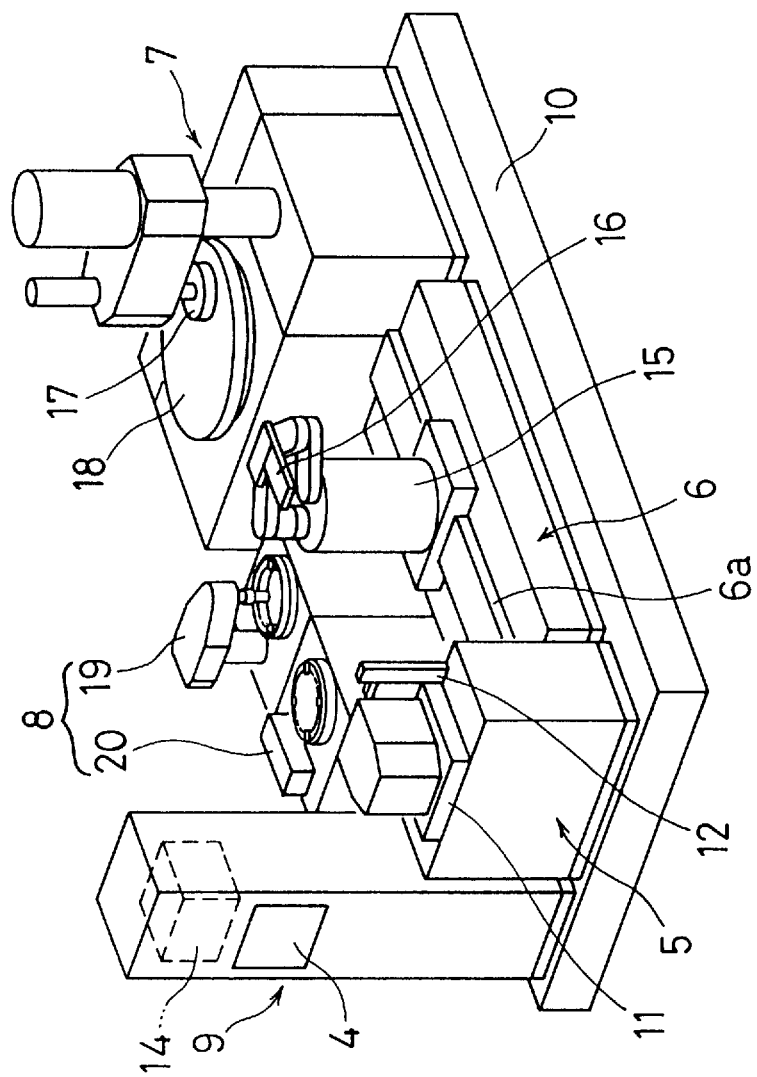
FIG. 2A is a perspective internal view of the polishing facility shown in FIG. 1.

Preferred embodiments will be explained in the following with reference to the drawings.

FIG. 1 shows an external view of a facility housing A with a delivery opening 3 to accept a cassette 2. When the cassette 2 containing the wafers 1 to be polished is delivered to the delivery opening 3, and the power to an operation panel 4 is turned on, one wafer 1 at a time is withdrawn to be polished automatically from inside the cassette 2, and the wafer 1 is polished, cleaned and returned to its original cassette 2. When all the wafers 1 inside the cassette 2 have been processed, the cassette is delivered to a next processing station.

Figure 2B:
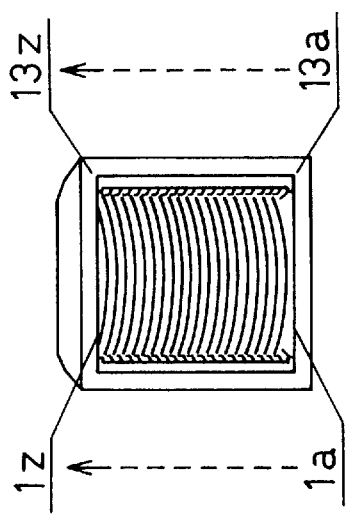
FIG. 2B is a perspective external view of a cassette.

FIG. 2 shows an inside view of the facility housing A comprises the polishing facility: a load/unload block 5 for delivery of cassette 2 containing the wafers 1; a transport block 6 for moving the wafers 1, polishing block 7 for polishing the wafers 1; cleaning block 8 for cleaning the polished wafers 1; and a control block 9 for controlling the operations of each of the functional blocks. All of these blocks are independently erected on a common base 10.

The load/unload block 5 comprises: a cassette stage 11 for placing a cassette 2; a mapping sensor 12 for determining (mapping) the number of wafers 1a–1z and the corresponding wafer shelves 13a–13z. The data from the load/unload block 5 is stored in a computer 14 in the control block 9.

The transport block 6 comprises a robot 15 disposed on a rail 6a permitting translation therealong; and fingers 16 for transferring a wafer 1a from one block to another block. Several robot units 15 can be provided on the rail 6a and operated as a robotic unit 15.

The polishing block 7 has a turntable 18 and an opposing topring 17. The turntable 18 has a polishing cloth mounted on its top surface to which a polishing solution is supplied during a polishing step.

The cleaning block 8 comprises a cleaning tank 19 for cleaning of the wafers 1 with purified water, and a drying tank 20. These are the only component devices comprising the cleaning block 8.

These five blocks operate independent of each other so that if any of the blocks is subjected to be exchanged, added or re-configured, such an action will not interfere with the operation of other functional blocks. Therefore, none of these blocks is arranged in a specific order, and various combinations of positioning and work flow directions are possible for a user.

Each one of these blocks, i.e. load/unload block 5, transport block 6, polishing block 7 and cleaning block 8, is provided with the following operating devices, i.e. a driver for driving the motor, an electrical terminal for supplying electrical power to the driver, a control valve for controlling the operations of air cylinder and process valves, air supply provisions for supplying air to the control valves, a conversion interface for control of signals for the driver and the control valves, as well as a communications terminal for receiving control signals.

Figure 3:
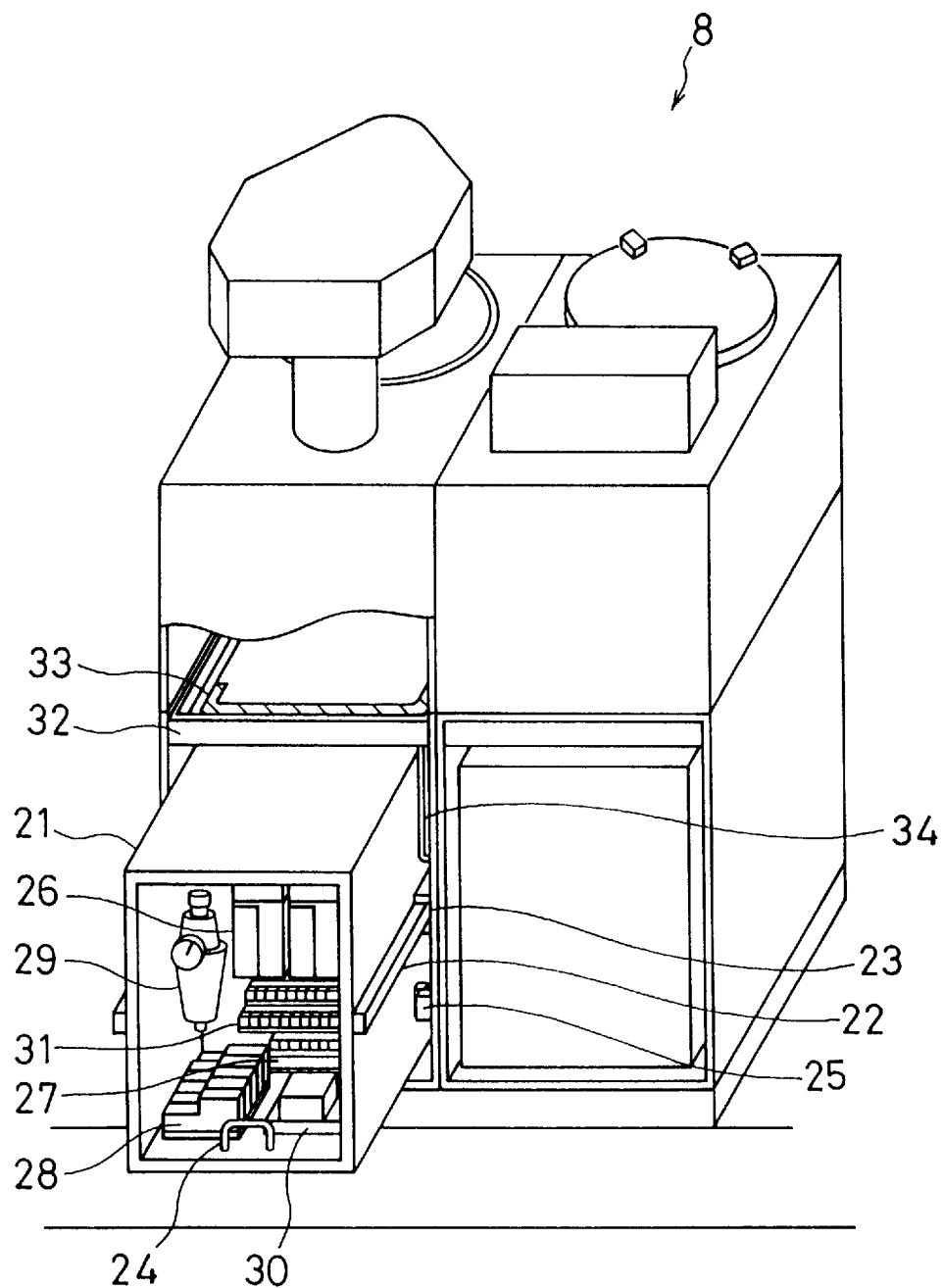
FIG. 3 is a second embodiment of the polishing facility.

The structure of such a unitized functional block will be explained with reference the cleaning block 8 shown in FIG. 3, as an example. The drawing shows a chassis 21, housing control devices for the cleaning block 8, being pulled out of the cleaning block 8. Each of the side surfaces of the chassis 21 is provided with a side bar 22 which engages with a rail 23, and the chassis 21 can be pulled out by a handle 24 by sliding on the rails 23. A stopper 25 is provided on the chassis 21 to prevent it from falling out. The cables and the piping in the chassis 21 are flexible and test operation can be performed while being operatively connected to the cleaning block 8.

Within the chassis 21, there is a driver 26 for generating electrical power to drive the motor for the cleaning brushes, an electrical terminal 27 for supplying power to the driver 26, an air cylinder for positioning the cleaning brush above the wafer, a control valve 28 for controlling a valve for delivering cleaning water, an air supply provision 29 for supplying air to the control valve 28, a conversion interface 30 and a communication terminal 31 for receiving control signals.

Above the drawer of the chassis 21, there is a drip tray 32 for preventing any drips, if the cleaning section should spring a leak, from entering into the electrical devices in the chassis 21. There is a water leak sensor 33 on the inside surface of the drip tray 32 to generate a warning signal when a leak should occur and the collected water is discharged through a drain pipe 34 connected to the system drain.

The provision of devices in the chassis 21, including a driver for driving the motor, an electrical terminal for supplying electrical power to the driver, a control valve for controlling the operations of air cylinder and process valves, air supply provisions for supplying air to the control valves, a conversion interface for controlling signals for the driver and the control valves, as well as a communications terminal for receiving control signals, is the same for other blocks in the facility, i.e. load/unload block 5, transport block 6 and polishing block 7.

Figure 4:
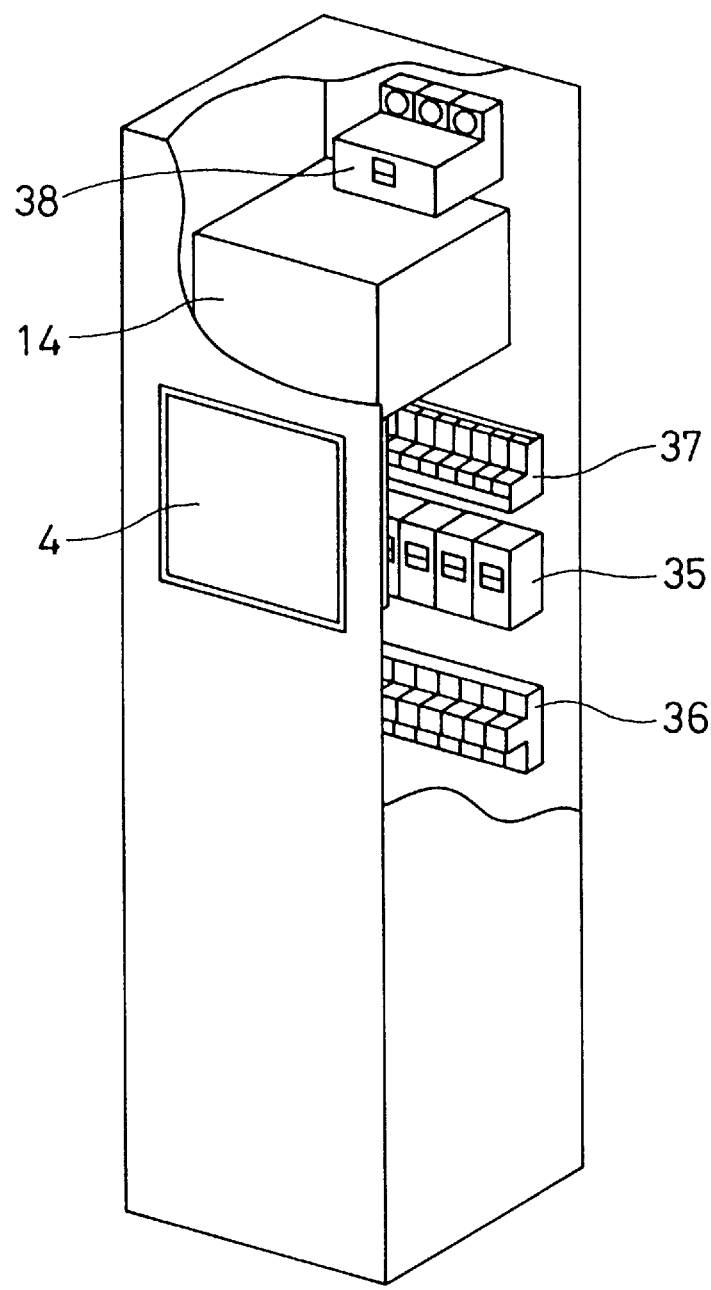
FIG. 4 is a perspective partial cutaway view of a control block.

FIG. 4 shows the control block 9 comprising: a power source 35 for supplying electrical power to each of the blocks 5, 6, 7 and 8 through an electrical terminal 36; a computer 14 for generating command signals; a communications terminal 37 to output control signals; an electrical input terminal 38 for receiving input of external electrical power; and an operation panel 4 for command of the facility.

The control device and the cleaning block 8 are connected with an electrical power line L for transmission of power from the electrical terminal 27 of the cleaning block 8 and the electrical terminal 36 of the control block 9, and control signals are transmitted via communication line C between the communication terminal 31 of the cleaning block 8 and the communication terminal 37 of the control block 9.

Figure 5:
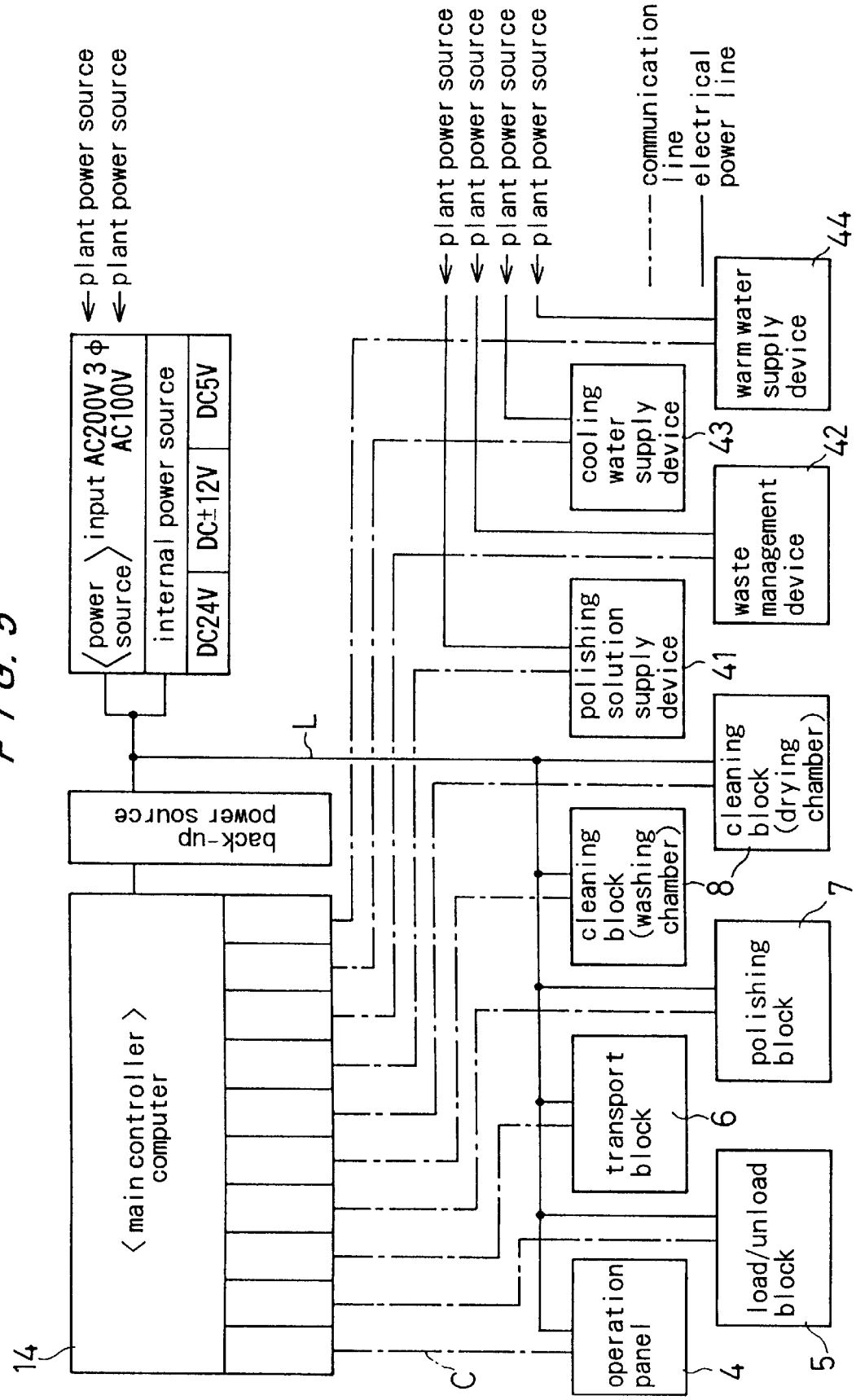
FIG. 5 is a block diagram of the control hardware of the first embodiment facility.

FIG. 5 shows a block diagram of the control hardware system. Each of the blocks 5–9 is electrically connected to a power source within the control panel, and the control device is communicated with the computer 14 which is the main controller for the control panel. Ancillary devices, i.e. the polishing solution supply device 41, waste management device 42, cooling water supply device 43 and the warm water supply device 44 are provided with their own separate control device, but the operational control of these ancillary devices is provided by the computer 14 in the polishing facility.

Figure 6:
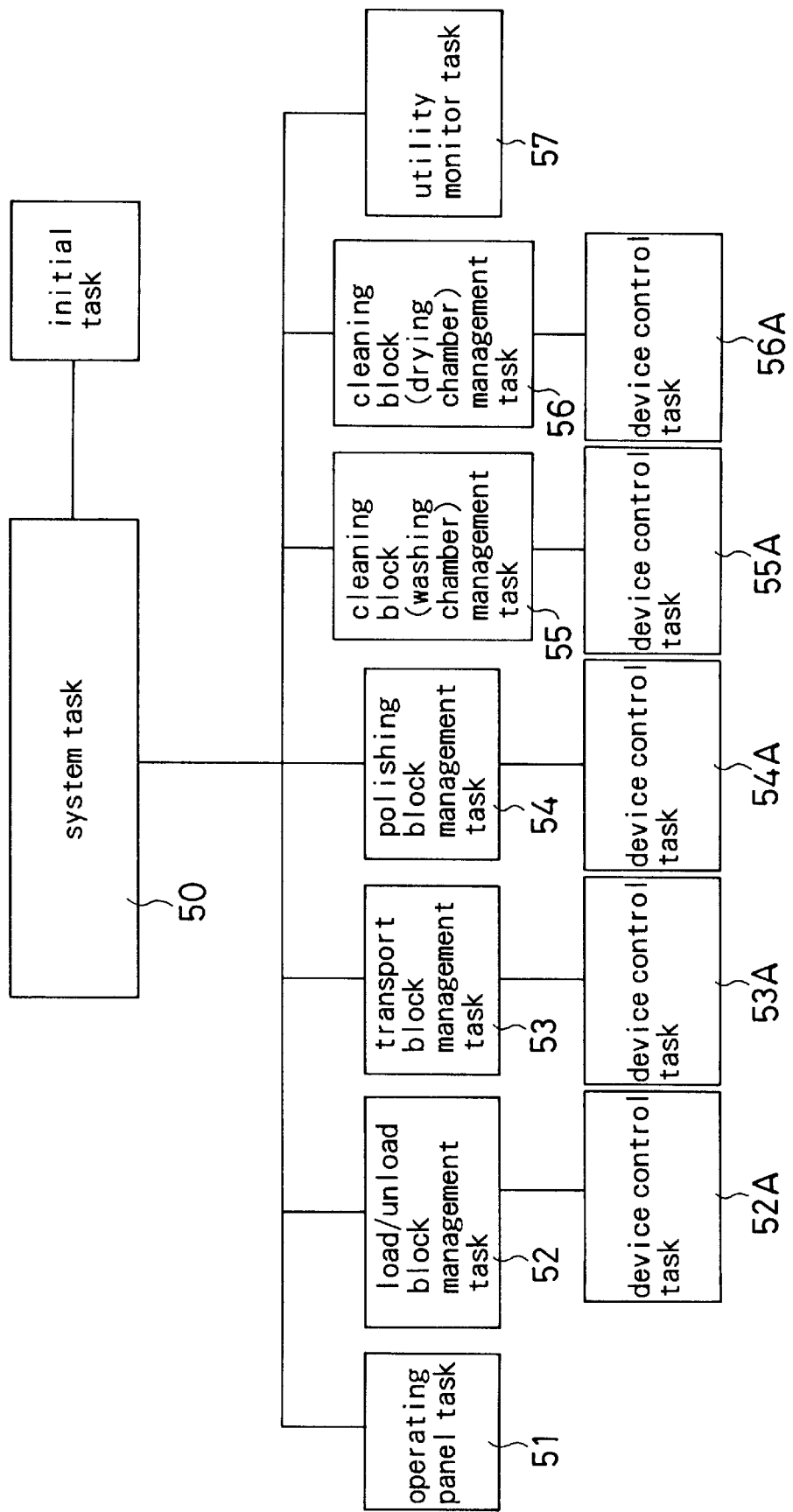
FIG. 6 is a schematic diagram of control hardware for the entire polishing facility including monitoring of ancillary devices.

FIG. 6 shows the organization of the tasks for the control system. The overall system task 50 comprises the following programs: an operating panel task 51; management tasks 52–56 for each block; and utility monitor task 57. Each of the management tasks 51–56 supports device control tasks 52A–56A for each block.

The operation of the polishing facility is explained in the following.

The cassette 2 which is delivered to the delivery opening 3 shown in FIG. 1 is placed on the stage 11 of load/unload block 5. The mapping sensor 12 determines the number of wafers 1a–1z stored in the wafer shelves 13a–13z, and these wafer data are stored in the computer 14 in the control block 9. When wafer mapping is completed, the finger 16 of the robot 15 disposed on the transport block 6 takes out a wafer 1a from a wafer shelf 13a in the cassette 2.

The relative position of the robot 15 with respect to the cassette 2 is stored in the computer 14 by the teaching of the robot 15 after positioning of each of the blocks has been decided. In other words, actions and positions of the robot 15 are generated by commands from the computer 14, and not restricted by geometrical constrictions imposed by the structures of the load/unload block 5 and the transport block 6 which carries the robot 15.

The wafer 1a taken out of the cassette 2 is attached to the topring 17 of the polishing block 7, and is polished on the turntable 18. The top surface of the turntable 18 is provided with a polishing cloth, and the wafer 1a is polished while the polishing solution is being supplied to the polishing surface of the wafer 1a.

The polished wafer 1a is transported to the cleaning block 8 by the robot 15, and is placed in the cleaning tank 19 of the cleaning block 8. When the cleaning is completed, the cleaned wafer 1a is placed in the drying tank 20 of the cleaning block 8 to remove the water, after which, the dried wafer 1a is taken out of the cleaning block 8 by the robot 15 to be returned to the wafer shelf 13a in the cassette. The relative position of the robot 15 with respect to the cleaning block is similarly memorized in the computer 14.

After completion of polishing of wafer 1a, each of the remaining wafers 1b–1z in the cassette 2 is individually subjected to polishing and returned one after another to the respective wafer shelf 13b–13z, the finished cassette 2 is exchanged for a unfinished cassette 2. The operational steps are performed through the device control task programs 52A–56A commanded by the respective management task programs 52–56.

There are a number of polishing parameters for producing an optimum surface finish on the wafer 1. Some of these parameters are: revolution speed and the pressing pressure of the topring 17 on the turntable 18 to suit the type of surface film being polished; rotation speed of the turntable 18; the type of polishing cloth mounted on the turntable 18; and type of polishing solution to be supplied. Suitable polishing parameters are chosen for different types of surface films and specified for use in the polishing step. The polishing solution varies greatly depending on the type of surface film to be polished, and for example, it is close to neutral if the film is $SiO_2$, but when the film is metallic, the solution may be acidic or alkaline. Therefore, the construction materials for polishing components are specially selected for their corrosion resistance properties. The cleaning process steps also vary according to the type of surface film, and the devices are also custom constructed.

Because of these operating requirements for the polishing facility, the three standard blocks, i.e. load/unload block 5, transport block 6 and the control block 9, can be standardized and they are available in a finish assembled condition as stock items. However, the polishing block 7 and the cleaning block 8 cannot be totally standardized, because of custom component requirements depending on the type of wafers to be polished and cleaned. For this reason, these blocks are in inventory in a semi-finished condition, and the parts are made available as optional choices. Therefore, a custom polishing facility to meet specific customer needs can be manufactured from standard blocks. It is clear that inventory parts can be held to a minimum, and the overall productivity of the polishing facility is significantly improved compared with an assembly based on individual devices. It is further clear that each block is controlled through a dedicated set of hardware and software designed for the particular operational mode of each block. Optional requirements can be readily accommodated to achieve a completely standardized manufacturing of the total polishing facility.

Figure 7:
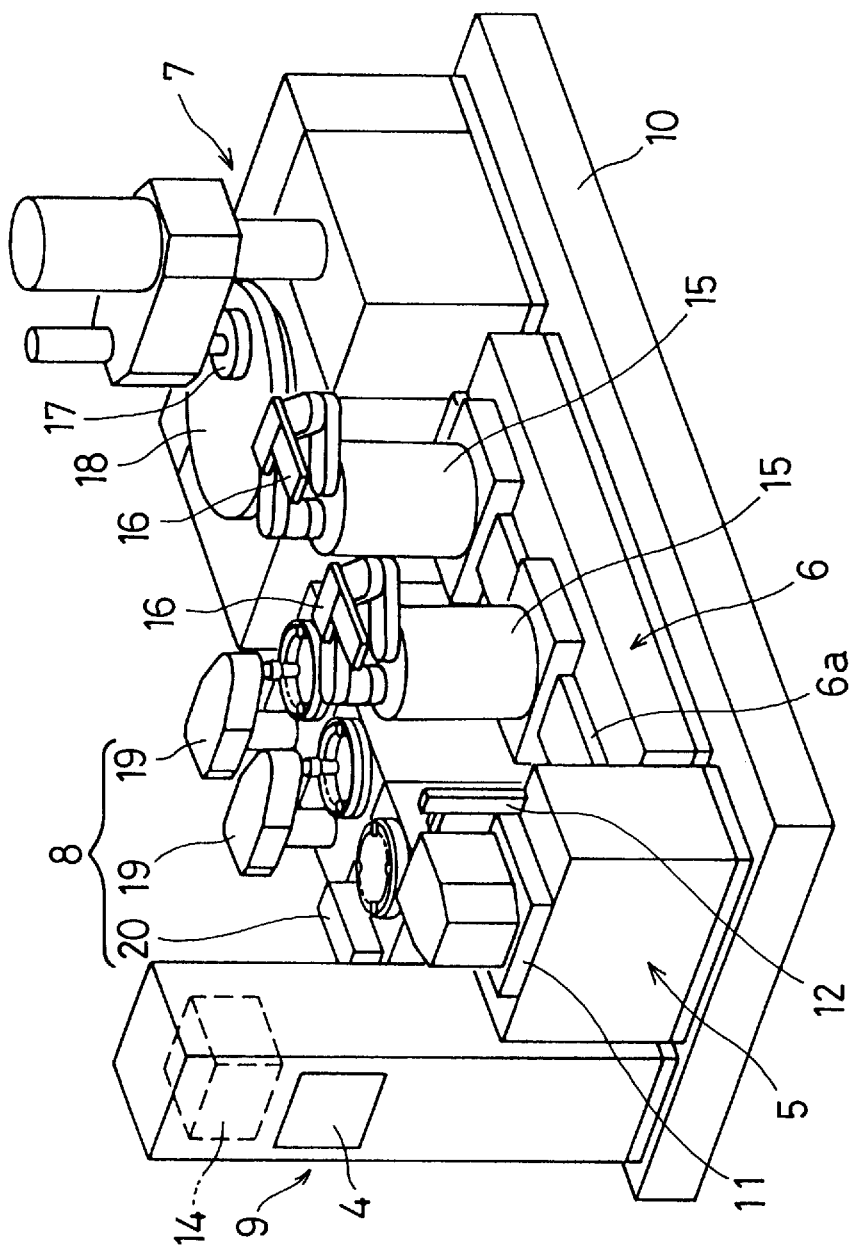
FIG. 7 is a perspective view of a second embodiment provided with an extra cleaning tank and an extra robot.

FIG. 7 shows an arrangement for demonstrating a good advantage of the features of the polishing facility presented above. The new arrangement shows an addition of a cleaning tank 19 in the cleaning block to improve the cleaning capability, and an addition of a robot 15 to improve the throughput. The load/unload block 5, polishing block 7 and the control block 9 are the same as in the base model. To manufacture such an arrangement, it is only necessary to electrically assemble the load/unload block 5, the transport block 6, the polishing block 7 and cleaning block 8 to the control block 9 through their dedicated cables and signal lines. The first four blocks can be assembled mechanically and electrically as block units. After the new arrangement is decided, the new relative positions of each block is memorized in the computer. Therefore, there is no need to separately handle inter-block connections, and modifications can be carried out freely, easily and at low capital and labor investments.

Figure 8:
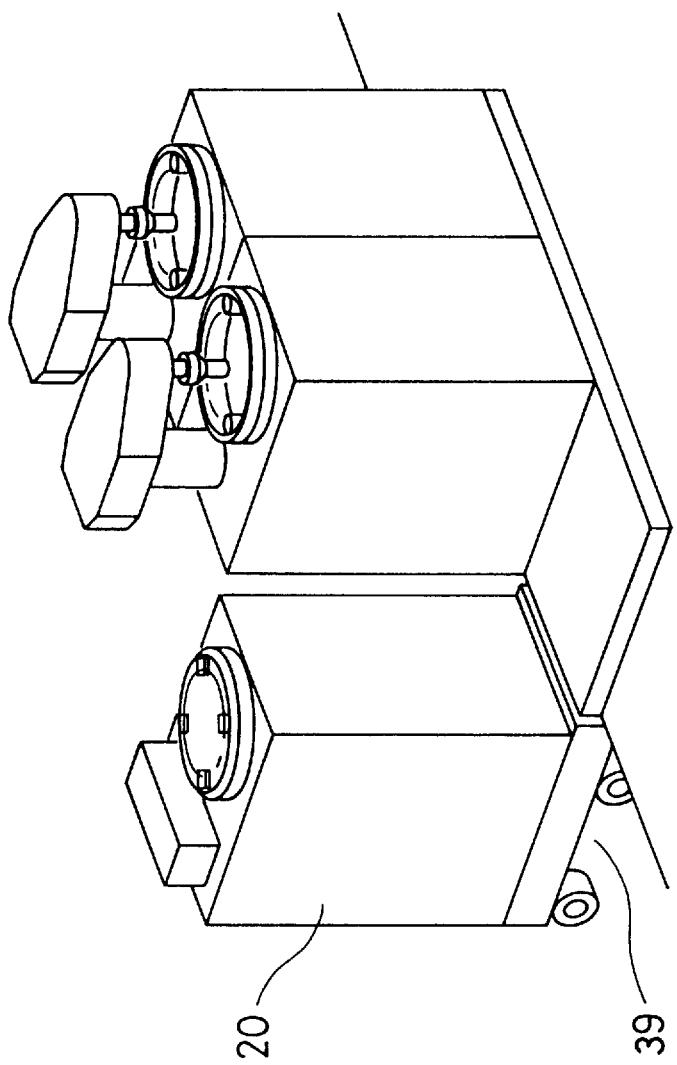
FIG. 8 is an illustration of removing a cleaning tank on a trolley for repair.

FIG. 8 illustrates a case of repairing the drying tank 20 in the cleaning block 8. Disassembling for repairs is carried in a separate room by wheeling drying tank 20 on a repair trolley 39 to minimize the generation of dust particles. When an entire cleaning block 8 is replaced with a new block 8, the relative positions are entered in the memory through teaching.

Figure 9:
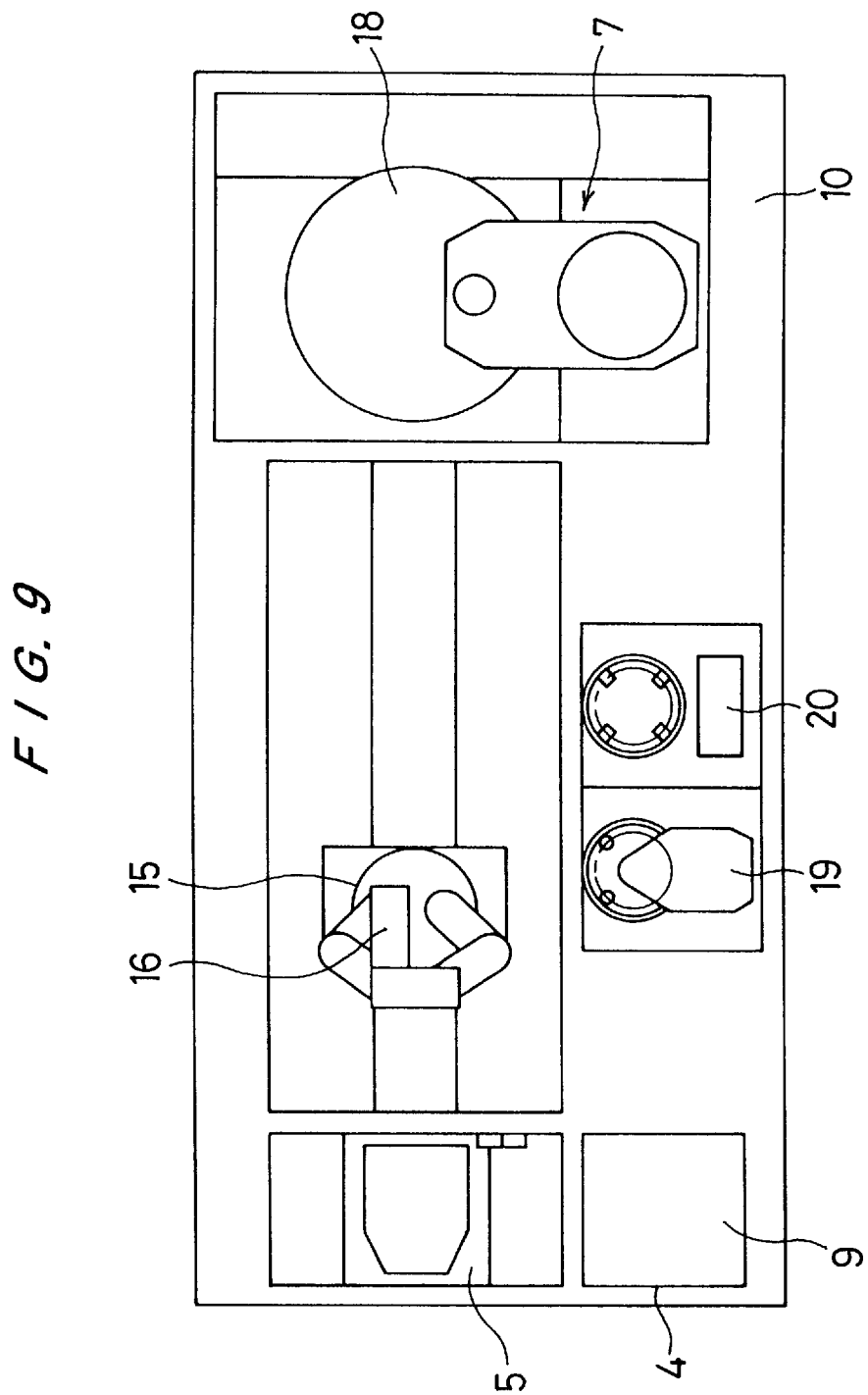
FIG. 9 is a plan view of a custom arrangement in which the positions of the load/unload block and the operation panel are interchanged.

FIG. 9 shows a case of a custom arrangement in which the positions of the load/unload block 5 and the operation panel 4 are interchanged. This is an another example to show that the polishing facility of the present invention is free from restrictions in positioning of blocks, and each block can be placed freely in any location suitable for the job at hand.

What is claimed is:

1. A modular polishing facility for polishing workpieces, said facility comprising:

a load/unload function module for receipt of a cassette for workpieces to be polished;

a transport function module for moving workpieces within said facility;

a polishing function module for polishing workpieces;

a cleaning function module for cleaning workpieces;

a control function module for controlling said facility;

each of said transport function module, said polishing function module and said cleaning function module including a driver for driving a motor, an electrical terminal for supplying electrical power to said driver, a conversion interface for control signals for said driver, and a communications terminal for receiving control signals; and said control function module including a power source for supplying electrical power to each of said load/unload function module, said transport function module, said polishing function module and said cleaning function module through an electrical terminal, a computer for generating command signals, an electrical input terminal for receiving input of external electrical power, and an operation panel for inputting commands for said facility.

2. A facility as claimed in claim 1, wherein each of said transport function module, said polishing function module and said cleaning function module further includes control valves for controlling operations of an air cylinder and process valves, and an air supply for supplying air to said control valves, and said conversion interface is for control signals for said control valves.

3. A facility as claimed in claim 2, wherein said load/unload function module includes a driver for driving a motor, an electrical terminal for supplying electrical power to said driver, control valves for controlling operations of an air cylinder and process valves, an air supply for supplying air to said control valves, a conversion interface for control signals for said driver and said control valves, and a communications terminal for receiving control signals.

4. A facility as claimed in claim 3, wherein, for each of said load/unload function module, said transport function module, said polishing function module and said cleaning function module, said driver, said electrical terminal, said control valves, said air supply, said conversion interface and said communications terminal thereof are housed in an individual chassis that is mounted to be pulled out from and pushed into the respective said module, thereby providing access thereto.

5. A facility as claimed in claim 1, wherein said cleaning function module further includes a drip tray having a leak sensor to protect an interior of the respective said chassis.

6. A facility as claimed in claim 1, wherein all of said modules are mountable in freely arrangeable positions on a frame of said facility.

7. A facility as claimed in claim 1, wherein at least one of said modules comprises plural sub-modules of the same function.

8. A facility as claimed in claim 1, wherein each of said load/unload function module, said transport function module, said polishing function module and said cleaning function module is operatively connected to said control function module by respective dedicated electrical power and communication lines, and further comprising respective dedicated control programs in each of said load/unload function module, said transport function control module, said polishing control module and said cleaning function control module.

9. A facility as claimed in claim 8, wherein each said control program includes a utility monitoring program.

10. A facility as claimed in claim 8, further comprising a polishing solution supply device, a waste management device, a cooling water supply device and a warm water supply device, each said device being operatively connected to said control function module by a respective dedicated communication line.

11. A facility as claimed in claim 1, wherein each of said modules is free of direct mechanical connection to any other of said modules.

12. A modular polishing facility for polishing workpieces, said facility comprising:

a frame;

a load/unload function module for receipt of a cassette for workpieces to be polished;

a transport function module for moving workpieces within said facility;

a polishing function module for polishing workpieces;

a cleaning function module for cleaning workpieces;

a control function module for controlling said facility; and said load/unload function module, said transport function module, said polishing module and said cleaning module being individually removably mounted on said frame without direct mechanical connection between any of said load/unload function module, said transport function module, said polishing function module and said cleaning function module.

13. A facility as claimed in claim 10, wherein each of said transport function module, said polishing function module and said cleaning function module includes a driver for driving a motor, an electrical terminal for supplying electrical power to said driver, a conversion interface for control signals for said driver, and a communications terminal for receiving control signals, and said control function module includes a power source for supplying electrical power to each of said load/unload function module, said transport function module, said polishing function module and said cleaning function module through an electrical terminal, a computer for generating command signals, an electrical input terminal for receiving input of external electrical power, and an operation panel for inputting commands for said facility.

14. A facility as claimed in claim 13, wherein each of said transport function module, said polishing function module and said cleaning function module further includes control valves for controlling operations of an air cylinder and process valves, and an air supply for supplying air to said control valves, and said conversion interface is for control signals for said control valves.

15. A facility as claimed in claim 14, wherein said load/unload function module includes a driver for driving a motor, an electrical terminal for supplying electrical power to said driver, control valves for controlling operations of an air cylinder and process valves, an air supply for supplying air to said control valves, a conversion interface for control signals for said driver and said control valves, and a communications terminal for receiving control signals.

16. A facility as claimed in claim 15, wherein, for each of said load/unload function module, said transport function module, said polishing function module and said cleaning function module, said driver, said electrical terminal, said control valves, said air supply, said conversion interface and said communications terminal thereof are housed in an individual chassis that is mounted to be pulled out from and pushed into the respective said module, thereby providing access thereto.

17. A facility as claimed in claim 13, wherein said cleaning function module further includes a drip tray having a leak sensor to protect an interior of the respective said chassis.

18. A facility as claimed in claim 12, wherein at least one of said modules comprises plural sub-modules of the same function.

19. A facility as claimed in claim 12, wherein each of said load/unload function module, said transport function module, said polishing function module and said cleaning function module is operatively connected to said control function module by respective dedicated electrical power and communication lines, and further comprising respective dedicated control programs for each of said load/unload function module, said transport function control module, said polishing control module and said cleaning function control module.

20. A facility as claimed in claim 19, wherein each said control program includes a utility monitoring program.

21. A facility as claimed in claim 19, further comprising a polishing solution supply device, a waste management device, a cooling water supply device and a warm water supply device, each said device being operatively connected to said control function module by a respective dedicated communication line.

* * * * *